(12) United States Patent
Ikonomov et al.

(10) Patent No.: US 10,374,131 B2
(45) Date of Patent: Aug. 6, 2019

(54) OPTOELECTRONIC COMPONENT WITH ELECTRICALLY-CONDUCTIVE ADHESIVE LAYER INCLUDING TITANIUM OXIDE AND METHOD FOR PRODUCING THE OPTOELECTRONIC COMPONENT

(71) Applicant: OSRAM Opto Semiconductors GmbH, Regensburg (DE)

(72) Inventors: Julian Ikonomov, Neutraubling (DE); Martin Lemberger, Neunkirchen (DE); Bjoern Muermann, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 13 days.

(21) Appl. No.: 15/747,728

(22) PCT Filed: Aug. 3, 2016

(86) PCT No.: PCT/EP2016/068558
§ 371 (c)(1),
(2) Date: Jan. 25, 2018

(87) PCT Pub. No.: WO2017/021455
PCT Pub. Date: Feb. 9, 2017

(65) Prior Publication Data
US 2018/0219132 A1    Aug. 2, 2018

(30) Foreign Application Priority Data

Aug. 5, 2015  (DE) .................. 10 2015 112 879

(51) Int. Cl.
*H01L 33/40*   (2010.01)
*H01L 33/36*   (2010.01)
(Continued)

(52) U.S. Cl.
CPC ............ *H01L 33/405* (2013.01); *H01L 33/36* (2013.01); *H01L 33/387* (2013.01); *H01L 33/42* (2013.01);
(Continued)

(58) Field of Classification Search
CPC ....... H01L 33/405; H01L 33/46; H01L 33/42; H01L 33/36; H01L 33/387; H01L 2933/0025; H01L 2933/0016; H01L 33/32
See application file for complete search history.

(56) References Cited

U.S. PATENT DOCUMENTS

| | | | | |
|---|---|---|---|---|
| 5,862,167 | A * | 1/1999 | Sassa | H01L 33/105 257/98 |
| 2015/0166340 | A1* | 6/2015 | Son | C01G 23/043 428/220 |
| 2016/0233357 | A1* | 8/2016 | Lee | H01L 31/1884 |

FOREIGN PATENT DOCUMENTS

| | | |
|---|---|---|
| DE | 102004057802 A1 | 6/2006 |
| DE | 102011102376 A1 | 11/2012 |

(Continued)

OTHER PUBLICATIONS

F. Weibel, E. Ritter, and R. Linsbod; "Properties of TiOx films prepared by electron-beam evaporation of titanium and titanium suboxides"; Aug. 1, 2003; Applied Optics, vol. 42, No. 22; pp. 4590-4593.*

*Primary Examiner* — William F Kraig
*Assistant Examiner* — Vicki B. Booker
(74) *Attorney, Agent, or Firm* — McDermott Will & Emery LLP

(57) ABSTRACT

The invention relates to an optoelectronic component. The component includes a semiconductor layer sequence having an active layer that is designed to emit electromagnetic radiation during operation of the component, at least one current-spreading layer on a radiation outlet surface of the (Continued)

Figure 1A:
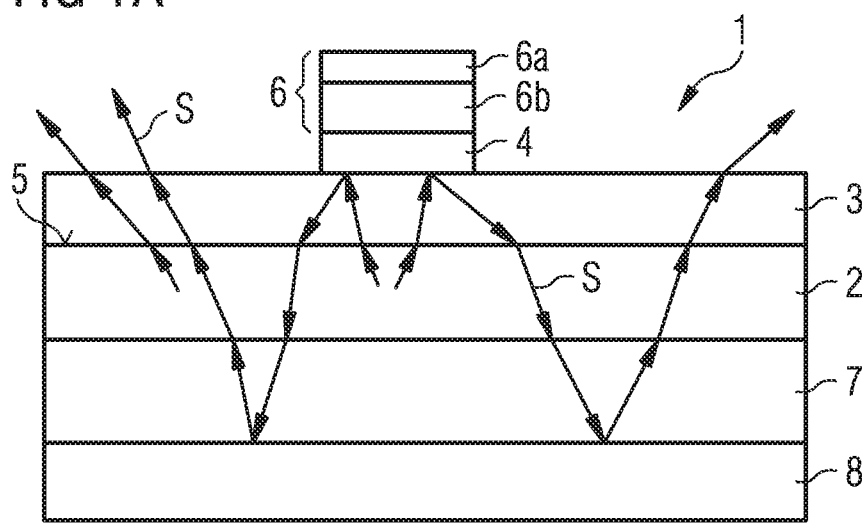

semiconductor layer sequence, wherein the current-spreading layer is connected to a contact structure in an electrically conductive manner by means of an adhesion layer. The adhesion layer comprises a titanium oxide, wherein in the titanium oxide the oxygen has the oxidation state $W_O$, with $W_O=-2$, and the titanium has the oxidation state $W_T$, with $0<W_T<+4$.

12 Claims, 2 Drawing Sheets

(51) Int. Cl.
    *H01L 33/38*     (2010.01)
    *H01L 33/42*     (2010.01)
    *H01L 33/46*     (2010.01)
    *H01L 33/32*     (2010.01)

(52) U.S. Cl.
    CPC .............. *H01L 33/46* (2013.01); *H01L 33/32* (2013.01); *H01L 2933/0016* (2013.01); *H01L 2933/0025* (2013.01)

(56) References Cited

FOREIGN PATENT DOCUMENTS

| EP | 0926744 A2 | 6/1999 |
|----|------------|--------|
| EP | 2 264 792 A2 | 12/2010 |
| EP | 2005488 B1 | 7/2013 |

\* cited by examiner

OPTOELECTRONIC COMPONENT WITH ELECTRICALLY-CONDUCTIVE ADHESIVE LAYER INCLUDING TITANIUM OXIDE AND METHOD FOR PRODUCING THE OPTOELECTRONIC COMPONENT

DESCRIPTION

The present application relates to an optoelectronic component and to a method for producing an optoelectronic component.

This patent application claims the priority of the German patent application DE 10 2015 112 879.9, the disclosure of which is incorporated herein by reference.

In optoelectronic components, such as light-emitting diodes (LED), transparent current expansion layers, e.g. made of ITO, on to which metal contact structures are applied or which is applied on to metal contact structures, are frequently used. The required current can be impressed into the semiconductor layer sequence through the current expansion layer. To fix the metal contact structures and the current expansion layer together, an adhesive layer is required, which is electrically conductive. A metal layer has often been used as the adhesive layer. However, radiation, which impinges on such a metal adhesive layer, is partially absorbed so that this radiation is not radiated to the outside and therefore the overall efficiency of the optoelectronic component is reduced.

It is known to fix metal contact structures on the current expansion layer with an adhesive layer of titanium. Here, the titanium adhesive layer is deposited as thin as possible to ensure a sufficient adhesion of the metal contact structures to the current expansion layer on the one hand, and on the other hand to keep the absorption of radiation through the adhesive layer in connection with the metal contact structures low. However, structures with adhesive layers of titanium of a layer thickness of 2 nm also show a reduction of the reflectivity by about 5% in comparison to metal contact structures without an adhesive layer of titanium.

One object is to provide an optoelectronic component which stands out through reduced absorption losses and at the same time good adhesion of the contact structures on the current expansion layer. A further object is to provide a method for producing an optoelectronic component.

These objects are achieved through the subject matter of the independent claims.

Advantageous embodiments and developments of the present invention are provided in the respective dependent claims.

An optoelectronic component is provided. The optoelectronic component includes a semiconductor layer sequence with an active layer, which is configured to emit electromagnetic radiation during operation of the component.

The term "semiconductor layer sequence" in this context means a layer sequence including more than one layer, for example a sequence of a p-doped and an n-doped semiconductor layer, wherein the layers are arranged one above the other and wherein at least one active layer is contained, which emits electromagnetic radiation.

The layer sequence can be configured as epitaxial layer sequence or as a radiation-emitting semiconductor chip with an epitaxial layer sequence, i.e. as an epitaxially grown semiconductor layer sequence. Here, the layer sequence can be configured, for example, based on InGaAlN. InGaAlN-based semiconductor chips and semiconductor layer sequences are in particular such ones, in which the epitaxially produced semiconductor layer sequence comprises a layer sequence of different individual layers, which contains at least one individual layer, which comprises a material from the III-V semiconductor compound material system $In_xAl_yGa_{1-x-y}N$ with $0 \le x \le 1$, $0 \le y \le 1$ and $x+y \le 1$. Semiconductor layer sequences which comprise at least one active layer based on InGaAlN can, for example, emit electromagnetic radiation in an ultraviolet to green wavelength range.

Alternatively or additionally, the semiconductor layer sequence or the semiconductor chip can also be based on InGaAlP, that is the semiconductor layer sequence can comprise different individual layers, out of which at least one individual layer comprises a material from the III-V semiconductor compound material system $In_xAl_yGa_{1-x-y}P$, with $0 \le x \le 1$, $0 \le y \le 1$ and $x+y \le 1$. Semiconductor layer sequences or semiconductor chips, which comprise at least one active layer based on InGaAlP can, for example emit preferably electromagnetic radiation with one or multiple spectral components in a green to red wavelength range.

Alternatively or additionally, the semiconductor layer sequence or the semiconductor chip can also comprise other III-V semiconductor compound material systems, for example an AlGaAs-based material, or II-VI semiconductor compound material systems. In particular, an active layer that comprises an AlGaAs-based material, can be suitable to emit electromagnetic radiation with one or multiple spectral components in a red to infrared wavelength range.

Besides the active layer, the semiconductor layer sequence can include further functional layers and functional regions such as p-doped or n-doped charge carrier transport layers, i.e. electron or hole transport layers, undoped or p-doped or n-doped confinement, cladding or wave conductor layers, barrier layers, planarization layers, buffer layers, protective layers and/or electrodes, as well as combinations thereof.

Furthermore, the semiconductor layer sequence can comprise a substrate, on which the above mentioned III-V or II-VI semiconductor compound material systems are deposited. Here, the substrate can include a semiconductor material, for example an above-mentioned semiconductor compound material system. In particular, the substrate can include sapphire, GaAs, GaP, GaN, InP, SiC and/or Ge or be of such a material. In particular, the substrate can be transparent to the electromagnetic radiation emitted by the active layer. Preferably, the substrate is of sapphire, on to which the semiconductor layer sequence is epitaxially grown.

As used herein, "transparent" means that a material, a layer or an element is at least partially transmissive for the entire visible electromagnetic spectrum or a sub-spectrum thereof. The radiation emitted by the semiconductor layer sequence can be in the visible range of the electromagnetic spectrum, for example.

According to at least one embodiment, at least one current expansion layer is arranged on a radiation exit surface of the semiconductor layer sequence. The current expansion layer serves to impress the required current into the semiconductor layer sequence.

That a layer or an element is arranged or applied "on" or "above" another layer or another element can mean here and in the following that the one layer or the one element is arranged directly in direct mechanical and/or electric contact on the other layer or the other element. Further, it can also mean that the one layer or the one element is arranged indirectly on or above the other layer or the other element. Here, further layers and/or elements can be arranged between the one and the other layer or between the one and the other element then.

Here, the radiation exit surface is a main surface of the semiconductor layer sequence. The radiation exit surface extends in particular parallel to a main extension plane of the semiconductor layers of the semiconductor layer sequence. For example, at least 20% or 75% or 90% of the radiation leaving the semiconductor layer sequence emerges via the radiation exit surface of the semiconductor layer sequence. In particular, the radiation exit surface is a boundary surface of the semiconductor layer sequence which borders the current expansion layer.

In one embodiment, the current expansion layer is electrically-conductively connected to a contact structure via an adhesive layer. The adhesive layer includes a titanium oxide, wherein the oxygen in the titanium oxide comprises the oxidation state $W_O$ with $W_O=-2$ and the titanium has the oxidation state $W_T$ with $0<W_T<+4$. Preferably, the adhesive layer consists of a titanium oxide, wherein the oxygen in the titanium oxide has the oxidation state $W_O$ with $W_O=-2$ and the titanium has the oxidation state $W_T$ with $0<W_T<+4$.

Such titanium oxides allow creating a very good adhesion between the current expansion layer and the contact structure. In addition, these titanium oxides have an electric conductivity whereby the required electric contacting of the current expansion layer with the contact structure is achieved. Additionally, the titanium oxides have a low absorption and thus an increased effective reflectivity of the contact structure, in particular of a metal contact structure, so that only little of the radiation emitted by the semiconductor layer sequence gets lost by absorption. Thus, the light yield, i.e. the efficiency of the component can be increased.

Compared to the titanium oxides in which the oxygen has the oxidation state $W_O=-2$ and the titanium has the oxidation state $0<W_T<+4$, $TiO_2$ with titanium in the oxidation state $W_T=+4$ does not exhibit electric conductivity, i.e. is electrically insulating.

According to one embodiment, the adhesive layer does not contain $TiO_2$. However, production-related contaminations of the adhesive layer with $TiO_2$ are not excluded. Preferably, the adhesive layer cannot consist of $TiO_2$.

According to at least one embodiment, the optoelectronic component thus comprises at least one contact structure, in particular an electric contact structure. The contact structure serves for the external electric contacting of the semiconductor layer sequence. The contact structure is electrically-conductively connected to the current expansion layer. In particular, the contact structure is electrically-conductively connected to the current expansion layer via the adhesive layer.

In one embodiment, the adhesive layer is formed to be electrically-conductive. As a result, it is possible to electrically-conductively connect the current expansion layer to the contact structure via the adhesive layer.

In one embodiment, the adhesive layer includes or consists of a titanium oxide, which is electrically conductive.

In one embodiment, the optoelectronic component comprises a further contact structure for the external electric contacting of the semiconductor layer sequence. By applying an electric voltage between the contact structures, charge carriers can be introduced in the active layer of the semiconductor layer sequence from different sides and recombine there while emitting radiation.

In one embodiment, the electric contact structure is formed of one or of multiple metals. Thus, preferably, it is a metal contact structure with metal properties. For example, the metal contact structure includes or consists of a gold or rhodium layer. The reflectivity of the metal contact structure is increased through the rhodium layer. In particular, the contact structure is arranged in the component so that the rhodium layer borders the adhesive layer. In particular, a direct contact exists between the rhodium layer and the adhesive layer.

In one embodiment, the metal of the contact structure is selected from a group including Pt, Pd, Ag, Al, Ti, Ni, Cr, Rh, Au, and combinations thereof. The contact structure can be formed as a metal stack of at least two layers of different metals, such as for example a gold or rhodium layer.

In one embodiment, the contact structure is arranged over the entire surface of the adhesive layer. In particular, that means that the contact structure does not have any direct mechanical contact to the current expansion layer, but is separated from it by the adhesive layer.

According to at least one embodiment, the contact structure includes or is a web, in a plan view of the radiation exit surface. The term "web" can mean that a length exceeds the width by at least a factor 2 or 4 or 8. For example, the factor is at 100.

In one embodiment, the titanium oxide is selected from a group which includes titanium oxides with titanium in the oxidation state $W_T=+3$ or $+2$, titanium suboxides, and combinations thereof.

With such titanium oxides, a very good adhesion between the current expansion layer and the contact structure can be achieved. At the same time, the current expansion layer can be electrically-conductively connected to the contact structure through the electric conductivity of these titanium oxides. Absorption losses can be reduced through the low extinction coefficient of the titanium oxides, and thus the efficiency of the component can be increased.

In one embodiment, the titanium suboxides have the formula $TiO_m$ with $0<m<2$, or $Ti_nO_{2n-1}$ with $n=3-10$.

In one embodiment, $Ti_2O$, $Ti_3O$ and/or $Ti_6O$ are used as titanium suboxides of the formula $TiO_m$ with $0<m<2$.

In one embodiment, $Ti_3O_5$, $Ti_4O_7$, $Ti_5O_9$, $Ti_6O_{11}$, $Ti_7O_{13}$, $Ti_8O_{15}$, $Ti_9O_{17}$ and/or $Ti_{10}O_{19}$ are used as titanium suboxides of the formula $Ti_nO_{2n-1}$ with $n=3-10$.

In one embodiment, the titanium oxide is selected from a group which includes TiO, $Ti_2O_3$, $Ti_2O$, $Ti_3O$, $Ti_6O$, $Ti_3O_5$, $Ti_4O_7$, $Ti_5O_9$, $Ti_6O_{11}$, $Ti_7O_{13}$, $Ti_8O_{15}$, $Ti_9O_{17}$, $Ti_{10}O_{19}$, and combinations thereof.

In one embodiment, the adhesive layer has a layer thickness between 1 nm and 100 nm, preferably between 1 nm and 50 nm, particularly preferably between 1 nm and 20 nm, for example 4 nm. In these ranges of layer thicknesses, an optimum adhesion between the contact structure and the current expansion layer as well as a high reflectivity of the radiation emitted by the semiconductor layer sequence can be achieved without significant increase of the contact resistance. The radiation which impinges on the contact structure through the adhesive layer is mainly reflected and can then still be coupled-out outward to the environment. Thus, absorption losses can be kept low and the efficiency of the component can be increased.

In one embodiment, a direct contact exists between the adhesive layer and the current expansion layer as well as between the current expansion layer and the adhesive layer, in particular a direct mechanical and electric contact.

In one embodiment, the current expansion layer includes or consists of a transparent, electrically conductive oxide.

Transparent, electrically-conductive oxides ("TCO", for short) are transparent, electrically-conductive materials, usually metal oxides such as for example doped zinc oxide, doped tin oxide, doped cadmium oxide, doped titanium oxide, doped indium oxide or indium tin oxide (ITO). Besides binary metal oxides such as ZnO, $SnO_2$ or $In_2O_3$, also ternary metal oxides such as $ZnSnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides belong to the group of TCOs. Furthermore, it can be possible that the TCOs do not necessarily correspond to a stoichiometric composition, and can also be p-doped or n-doped.

In one embodiment, the current expansion layer has a thickness of at least 30 nm or 50 nm or 70 nm, for example 115 nm. Alternatively or additionally, the thickness of the current expansion layer is 200 nm, or 250 nm or 180 nm at most.

Furthermore, one or multiple reflective layers can be applied on a surface of the semiconductor layer sequence facing away from the current expansion layer, for example. Preferably, the one or multiple reflective layer is arranged on the side of the substrate facing away from the semiconductor layer sequence. Such reflective layers are known to a person skilled in the art, in particular with respect to design and structure, and are therefore not described in detail here. Through the reflective layer, the radiation emitted by the active layer of the semiconductor layer sequence can be reflected and thus be coupled-out to the environment through the radiation exit surface.

In one embodiment, the at least one current expansion layer is arranged above the semiconductor layer sequence, the adhesive layer above the at least one current expansion layer, and the contact structure above the adhesive layer.

In one embodiment, the contact structure is arranged above the semiconductor layer sequence, the adhesive layer above the contact structure and the at least one current expansion layer above the adhesive layer.

In one embodiment, the optoelectronic component is a light-emitting diode (LED).

The provided embodiments of the optoelectronic component can be produced according to the method described in the following. All features of the optoelectronic component mentioned in conjunction with the method can also be features of the above-described exemplary embodiments of the optoelectronic component and vice versa.

A method for producing an optoelectronic component is provided. The method includes the method steps:
A) Providing a semiconductor layer sequence with an active layer configured to emit electromagnetic radiation during operation of the component,
B) Applying a current expansion layer on to a radiation exit surface of the semiconductor layer sequence,
C) Applying an adhesive layer on to the current expansion layer,
D) Applying a contact structure on to the current expansion layer.

In particular, the method steps are performed in the specified order. This does not exclude the presence of intermediate steps.

According to one embodiment, method step C) includes the following method steps:
C1) Vaporization of a titanium oxide, wherein the oxygen in the titanium oxide has the oxidation state $W_O$ with $W_O=-2$ and the titanium has the oxidation state $W_T$ with $0<W_T<+4$,
C3) Depositing a titanium oxide for forming the adhesive layer, wherein the oxygen in the titanium oxide has the oxidation state $W_O$ with $W_O=-2$ and the titanium has the oxidation state $W_T$ with $0<W_T<+4$.

As an alternative to method step C1), a method step C1') can be performed:
C1') Vaporization of titanium while supplying oxygen. The oxygen is elemental oxygen.

In one embodiment, an oxidation of the titanium with the supplied oxygen is effected in method step C1') after vaporization of the titanium. A titanium oxide results, wherein the oxygen in the titanium oxide has the oxidation state $W_O$ with $W_O=-2$ and the titanium has the oxidation state $W_T$ with $0<W_T<+4$.

In one embodiment, the oxygen supply is effected in method step C1') in a controlled manner. Controlled oxygen supply means that the amount of supplied oxygen is varied or adjusted depending on the amount of vaporized titanium and depending on the degree of oxidation of the titanium in the resulting titanium oxide.

In one embodiment, vaporization is effected in vacuum in method step C1) or C1').

In one embodiment, vaporization is effected through a cathode evaporation, which can also be referred to as sputtering, in method step C1) or C1').

In one embodiment, method step C) includes a further method step C2):
C2) Oxidation of the titanium oxide. The oxidation can be effected partially or completely.

That the oxidation is effected partially or completely means that only some of the molecules of the titanium oxide are oxidized, or all or almost all molecules of the titanium oxide. In particular, the conditions when oxidizing are selected such that the titanium is not oxidized to the oxidation state +4. This can be achieved through controlled supply of elemental oxygen. The oxidation degree of the titanium depends on the partial pressure of the oxygen.

According to one embodiment, method step C) is performed in vacuum.

In one embodiment, the titanium oxide is performed in vacuum in method step C1) at a temperature which is higher compared to room temperature. Heating can be effected by means of an electron beam.

It is possible that the titanium oxide is at least partially oxidized in method step C1).

In one embodiment, the oxidation in method step C2) is effected while supplying elemental oxygen. Preferably, the supply of oxygen is effected in a controlled manner so that the titanium is not oxidized to oxidation state +4 and the developing titanium oxide has the desired oxidation degree.

Through the oxidation in method step C2), the titanium oxide evaporated in method step C1) or developing in method step C1') and deposited in method step C3) can be different. For example, TiO, preferably $Ti_3O_5$ is used in method step C1). This is at least partially oxidized, so that the deposited titanium oxide comprises a combination of different titanium oxides with oxygen in the oxidation state $W_O=-2$ and titanium in the oxidation state $W_T$ with $0<W_T<+4$.

Further advantageous embodiments and developments of the invention result from the exemplary embodiments described in the following in conjunction with the figures.

Figure 1B:
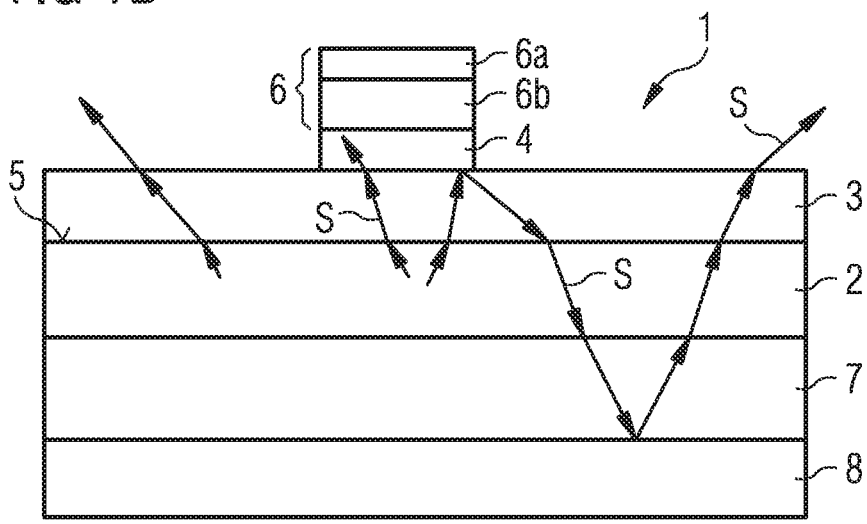

The figures show in:
FIGS. 1A and 1B schematic illustrations of exemplary embodiments of optoelectronic components described herein,
FIG. 2 the reflectivity of various layers depending on the wavelength,
FIG. 3 extinction coefficients of various materials depending on the wavelength.

In FIG. 1A, an example of an optoelectronic component 1 according to the invention is shown in a schematic sectional view. The optoelectronic component 1 is in particular a light-emitting diode and includes a substrate 7, which preferably is a sapphire substrate and a growth substrate for a semiconductor layer sequence 2. The semiconductor layer sequence 2 grown on the substrate 7 includes an n-side and a p-side and an active layer therebetween (not shown here). For example, the semiconductor layer sequence 2 is based on GaN. A current expansion layer 3, e.g. of ITO, is located on a radiation exit surface 5 of the semiconductor layer sequence 2 facing away from the substrate 7. The current expansion layer 3 has, for example, a thickness between 50 and 150 nm. The current expansion layer 3 preferably borders the p-side of the semiconductor layer sequence 2. A contact structure 6 is arranged above the current expansion layer 3. The contact structure 6 is preferably configured for electrically contacting the p-side of the semiconductor layer sequence 2. The contact structure 6 consists of a layer 6a and a layer 6b. The layer 6a is formed, for example, of gold and the layer 6b, which is arranged closer to the semiconductor layer sequence 2, is of rhodium. In particular, the layer 6b serves to increase the reflectivity of the contact structure 6. The layer 6b of rhodium therefore has a high reflectivity. Between the contact structure 6 and the current expansion layer 3, an adhesive layer 4 is arranged. The adhesive layer 4 has a direct contact to the current expansion layer 3 and the layer 6b of the contact structure 6. In particular, the adhesive layer 4 is arranged between the contact structure 6 and the current expansion layer 3 so that no direct mechanical contact exists between the contact structure 6 and the current expansion layer 3. In particular, the adhesive layer 4 does not project beyond the contact structure 6. In a plan view of the component 1, the adhesive layer 4 is thus completely covered by the contact structure 6. The adhesive layer 4 is formed of a titanium oxide. The titanium oxide is selected from a group which includes $Ti_3O_5$, $Ti_4O_7$, $Ti_5O_9$, $Ti_6O_{11}$, $Ti_7O_{13}$, $Ti_8O_{15}$, $Ti_9O_{17}$, $Ti_{10}O_{19}$, and combinations thereof. For example, the adhesive layer is produced through evaporation of $Ti_3O_5$ in vacuum, partial oxidation of $Ti_3O_5$ and depositing the partially oxidized $Ti_3O_5$. Through the electric conductivity of the titanium oxide and thus of the adhesive layer 4, the contact structure 6 is electrically-conductively connected to the current expansion layer 3 via the adhesive layer 4. The adhesive layer 4 has a layer thickness between 1 nm and 100 nm. In these ranges of the layer thicknesses, an optimum adhesion between the contact structure 6 and the current expansion layer 3 as well as a high reflectivity of the radiation S emitted by the semiconductor layer sequence 2 is obtained. If the radiation S emerges through the radiation exit surface 5 and impinges on the contact structure 6 through the adhesive layer 4, it is reflected to a predominant part. At a reflective layer 8, which is arranged at the surface of the substrate 7 facing away from the semiconductor layer sequence 2, the radiation S is reflected and thus can still be radiated outward through the radiation exit surface 5 and the current expansion layer 3. The reflective layer 8 can, for example, be a silver mirror or it can be a layer stack of alternating layers of $SiO_2$ and $TiO_2$. The selected layer thickness of the reflective layer 8 depends on the wavelength of the radiation S emitted by the semiconductor layer sequence 2. The individual optical layer thicknesses in the layer stack are, for example, about ¼ of the wavelength of the radiation S emitted by the semiconductor layer sequence 2, if it is a radiation in the blue wavelength range of the electromagnetic spectrum. Overall, also a main part of the radiation S, which first impinges on the adhesive layer 4, can still be coupled-out to the environment. Thus, only small absorption losses result, and the efficiency of the component 1 can thus be increased. In particular, the component 1 is more efficient compared to a component in which the adhesive layer is formed of titanium, as is known from the prior art.

In FIG. 1B, an example of an optoelectronic component 1 from the prior art is shown in a schematic sectional view. The component 1 exhibits the same structure as the component according to the invention shown in FIG. 1A. The materials of the layers and elements can be selected as described in FIG. 1A. The only difference is the adhesive layer 4. The adhesive layer 4 is, as known from the prior art, formed of titanium and has a layer thickness of 2 nm. Though a good adhesion of the contact structure 6 on the current expansion layer 3 can be ensured and the contact structure 6 can be electrically-conductively connected to the current expansion layer 3 via the adhesive layer 4, but the adhesive layer 4 of titanium, even with a layer thickness of only 2 nm, has a high absorption of the radiation S emitted by the semiconductor layer sequence 2. Compared to the component illustrated in FIG. 1A, the radiation S is highly absorbed by the adhesive layer 4 and reflected only to a small extent, so that the absorbed radiation S can no longer be radiated outward to the environment and so the efficiency of this component is significantly less than that of the component according to the invention. A titanium layer with a layer thickness of 2 nm reduces the reflectivity of the contact structure 6 by about 5% compared to a contact structure 6, which without adhesive layer 4 is arranged directly on the current expansion layer 3.

Figure 2:
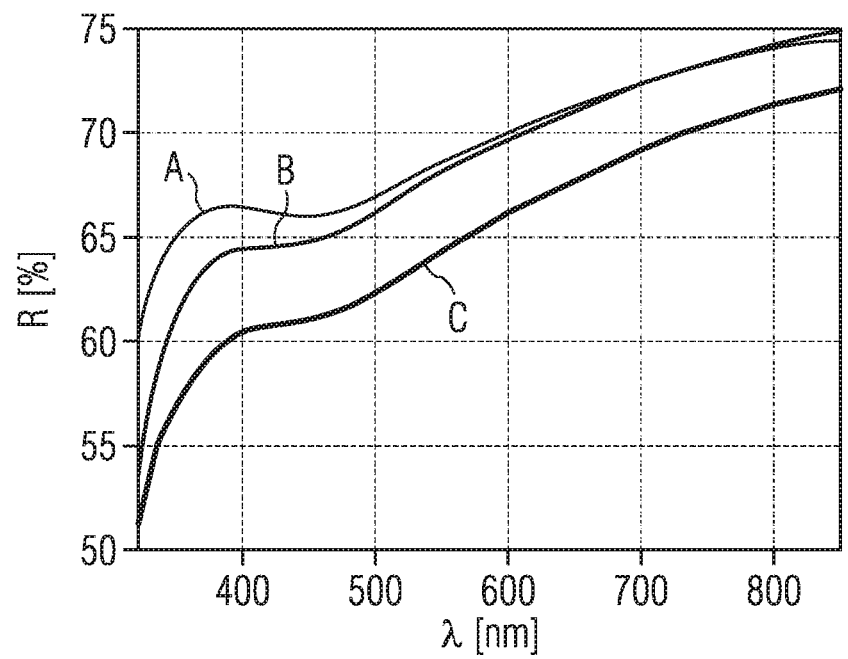

In FIG. 2, the reflectivity R in % is plotted against the wavelength λ in nm. The curve denoted with reference character A shows the reflectivity of a layer of rhodium, the curve denoted with reference character B shows the reflectivity of a layer sequence of a layer of titanium oxide and a layer of rhodium, the curve denoted with reference character C shows the reflectivity of a layer sequence of a layer of titanium and a layer of rhodium. The illustrated reflectivity of the curves B and C refers to the fact that the radiation impinges on the titanium oxide layer or on the titanium layer. The titanium oxide layer is produced through evaporating $Ti_3O_5$ in vacuum, partial oxidation of the $Ti_3O_5$ and depositing the partially oxidized $Ti_3O_5$. All layers of rhodium have the same layer thickness. The layer of titanium and the layer of titanium oxide each have a layer thickness of 2 nm. As can be seen, the solution known from the prior art of a layer of titanium in conjunction with a layer of rhodium, for example of a contact structure shows a comparatively low reflectivity and thus an increased absorption of radiation in a wavelength range of 350 nm to 850 nm. The adhesive layer of titanium oxide according to the invention in conjunction with a layer of rhodium has comparatively the same reflectivity as a rhodium layer alone. Advantageously, a good adhesion of a layer of a transparent conductive oxide, such as ITO, with a layer of rhodium, can also be obtained with the adhesive layer according to the invention. In addition, the adhesive layer is electrically-conductive, so that a required electric connection of a current expansion layer, for example of ITO, and a contact structure can be ensured in an optoelectronic component. The reflectivity of the adhesive layer according to the invention of titanium oxide is substantially higher than that of a layer known from the prior art having the same thickness of titanium. Thus, the adhesive layer according to the invention of titanium oxide in conjunction with a contact structure of rhodium and possibly another metal exhibits an increased reflectivity and thus a reduced absorption of the radiation emitted by the semiconductor layer sequence, so that the light yield of an optoelectronic component can be advantageously increased.

Figure 3:
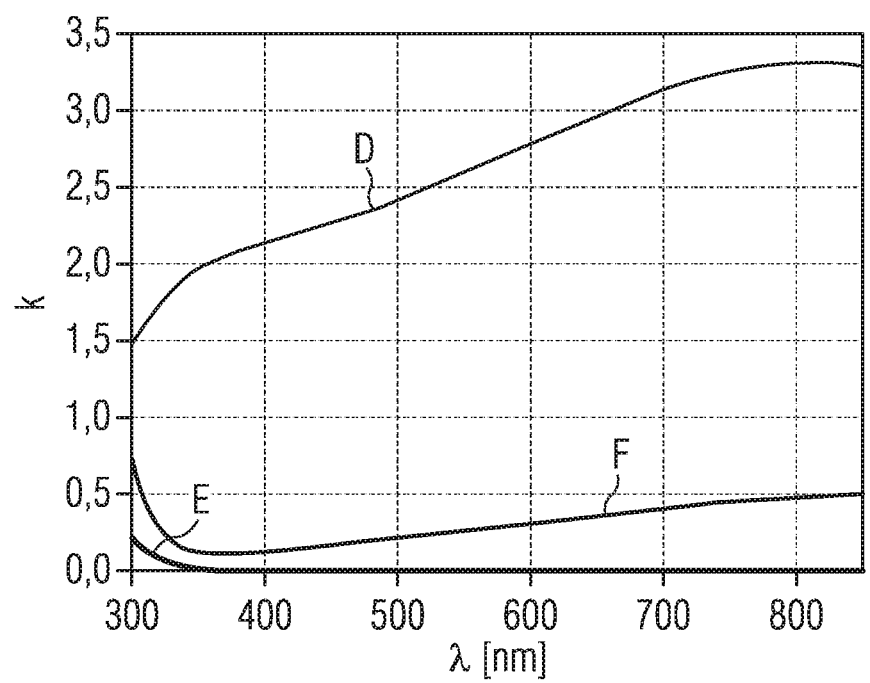

In FIG. 3, extinction coefficients k of various materials depending on the wavelength λ in nm are shown. The curve denoted with reference character D shows the extinction coefficient of a layer of titanium, the curve denoted with reference character E shows the extinction coefficient of a layer of titanium oxide, and the curve denoted with reference character F shows the extinction coefficient of a layer according to the invention of titanium oxide with oxygen in the oxidation state $W_O=-2$ and titanium in the oxidation state $W_T$ with $0<W_T<+4$. The higher the extinction coefficient, the higher the absorption of the electromagnetic radiation impinging on the layer by the material. As can be seen, the adhesive layer according to the invention of titanium oxide with the reference character F has a small extinction coefficient in the visible range of the electromagnetic spectrum compared to a titanium layer. Even lower values are found for a layer of titanium oxide which, however, can not be used as adhesive layer due to a missing electric conductivity, in order to electrically-conductively connect the current expansion layer to the contact structure.

The invention described herein is not limited through the description by means of the exemplary embodiments, the invention rather includes each new feature as well as each combination of features, which in particular includes each combination of features in the claims, even if this feature or this combination is not per se explicitly provided in the claims or exemplary embodiments.

LIST OF REFERENCE CHARACTERS

1 Optoelectronic component
2 Semiconductor layer sequence
3 Current expansion layer
4 Adhesive layer
5 Radiation exit surface
6 Contact structure
7 Substrate
8 Reflective layer
S Radiation

The invention claimed is:

1. An optoelectronic component, including
a semiconductor layer sequence with an active layer, which is configured to emit electromagnetic radiation during operation of the component,
at least one current expansion layer on a radiation exit surface of the semiconductor layer sequence, wherein the current expansion layer is electrically-conductively connected to a contact structure via an adhesive layer and the adhesive layer includes a titanium oxide, wherein the oxygen in the titanium oxide has the oxidation state $W_O$ with $W_O=-2$ and the titanium has the oxidation state $W_T$ with $0<W_T<+4$, wherein
the contact structure comprises one or multiple metals,
the current expansion layer consists of a transparent, electrically conductive oxide, and
the adhesive layer is in direct contact with the contact structure and the current expansion layer.

2. The component according to claim 1, wherein the adhesive layer is electrically conductive.

3. The component according to claim 1, wherein the titanium oxide is selected from a group which includes titanium oxides with titanium in the oxidation state $W_T=+3$ or +2, titanium suboxides and combinations thereof.

4. The component according to claim 3, wherein the titanium suboxides have the formula $Ti_nO_{2n-1}$ with n =3-10.

5. The component according to claim 1, wherein the titanium oxide is selected from a group including $Ti_2O_3$, $Ti_2O$, $Ti_3O$, $Ti_6O$, $Ti_3O_5$, $Ti_4O_7$, $Ti_5O_9$, $Ti_6O_{11}$, $Ti_7O_{13}$, $Ti_8O_{15}$, $Ti_9O_{17}$, $Ti_{10}O_{19}$, and combinations thereof.

6. The component according to claim 1, wherein the adhesive layer consists of titanium oxide.

7. The component according to claim 1, wherein the adhesive layer has a layer thickness of between 1 nm and 100 nm.

8. The component according to claim 1, which includes a substrate of sapphire, onto which the semiconductor layer sequence is epitaxially grown.

9. The component according to claim 8, which includes a reflective layer arranged on the surface of the substrate facing away from the semiconductor layer sequence.

10. A method for producing an optoelectronic component, including the method steps:
A) providing a semiconductor layer sequence with an active layer configured to emit electromagnetic radiation during operation of the component;
B) applying a current expansion layer on to a radiation exit surface of the semiconductor layer sequence;
C) applying an adhesive layeron to the current expansion layer;
D) applying a contact structureon to the current expansion layer; wherein the method step C) includes the following method steps:
C1) vaporization of a titanium oxide, wherein the oxygen in the titanium oxide has the oxidation state $W_O$ with $W_O=-2$ and the titanium has the oxidation state $W_T$ with $0<W_T<+4$, or
C1') vaporization of titanium while supplying oxygen;
C3) depositing a titanium oxide for forming the adhesive layer (4), wherein the oxygen in the titanium oxide has the oxidation state $W_O$ with $W_O=-2$ and the titanium has the oxidation state $W_T$ with $0<W_T<+4$, wherein the adhesive layer includes a titanium suboxide with the formula $Ti_3O$ or $Ti_6O$ or $Ti_nO_{2n-1}$ with n=3-10.

11. The method according to claim 10, which includes a further method step C2): C2) Oxidation of the titanium oxide.

12. An optoelectronic component, including
a semiconductor layer sequence with an active layer, which is configured to emit electromagnetic radiation during operation of the component,
at least one current expansion layer on a radiation exit surface of the semiconductor layer sequence, wherein the current expansion layer is electrically-conductively connected to a contact structure via an adhesive layer and the adhesive layer includes a titanium suboxide with the formula $Ti_3O$ or $Ti_6O$ or $Ti_nO_{2n-1}$ with n=3-10.

* * * * *

UNITED STATES PATENT AND TRADEMARK OFFICE
CERTIFICATE OF CORRECTION

PATENT NO. : 10,374,131 B2
APPLICATION NO. : 15/747728
DATED : August 6, 2019
INVENTOR(S) : Julian Ikonomov et al.

It is certified that error appears in the above-identified patent and that said Letters Patent is hereby corrected as shown below:

In the Claims

In Column 10, Line 31:
Replace "layeron" with --layer on--

In Column 10, Line 33:
Replace "structureon" with --structure on--

Signed and Sealed this
Eighth Day of October, 2019

Andrei Iancu
*Director of the United States Patent and Trademark Office*